(12) United States Patent
Sato et al.

(10) Patent No.: US 8,669,608 B2
(45) Date of Patent: Mar. 11, 2014

(54) METHOD FOR MANUFACTURING NONVOLATILE SEMICONDUCTOR STORAGE DEVICE AND NONVOLATILE SEMICONDUCTOR STORAGE DEVICE

(75) Inventors: Mitsuru Sato, Mie-ken (JP); Megumi Ishiduki, Mie-ken (JP); Masaru Kidoh, Tokyo (JP); Atsushi Konno, Mie-ken (JP); Yoshihiro Akutsu, Mie-ken (JP); Masaru Kito, Mie-ken (JP); Yoshiaki Fukuzumi, Kanagawa-ken (JP); Ryota Katsumata, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 13/419,984

(22) Filed: Mar. 14, 2012

(65) Prior Publication Data

US 2013/0075805 A1 Mar. 28, 2013

(30) Foreign Application Priority Data

Sep. 22, 2011 (JP) ................................. 2011-206893

(51) Int. Cl.
*H01L 29/792* (2006.01)
(52) U.S. Cl.
USPC ............ 257/324; 257/E29.309; 257/E21.473; 257/752; 257/754; 257/758
(58) Field of Classification Search
USPC .................. 257/752, 754, 758, 324, E29.309, 257/E21.473
See application file for complete search history.

(56) References Cited

U.S. PATENT DOCUMENTS

| | | | | |
|---|---|---|---|---|
| 7,847,342 | B2 * | 12/2010 | Fukuzumi et al. | 257/324 |
| 8,008,710 | B2 * | 8/2011 | Fukuzumi et al. | 257/326 |
| 8,194,467 | B2 * | 6/2012 | Mikajiri et al. | 365/185.29 |
| 2009/0146206 | A1 * | 6/2009 | Fukuzumi et al. | 257/324 |
| 2010/0038703 | A1 * | 2/2010 | Fukuzumi et al. | 257/326 |
| 2010/0207195 | A1 | 8/2010 | Fukuzumi et al. | |
| 2012/0098050 | A1 * | 4/2012 | Shim et al. | 257/324 |
| 2012/0132981 | A1 * | 5/2012 | Imamura et al. | 257/321 |
| 2012/0241844 | A1 * | 9/2012 | Iguchi et al. | 257/324 |

(Continued)

FOREIGN PATENT DOCUMENTS

JP 2009-135324 A 6/2009

OTHER PUBLICATIONS

U.S. Appl. No. 13/045,819, filed Mar. 11, 2011, Hiroyasu Tanaka, et al.

(Continued)

*Primary Examiner* — Julio J Maldonado
*Assistant Examiner* — Jaehwan Oh
(74) *Attorney, Agent, or Firm* — Oblon, Spivak, McClelland, Maier & Neustadt, L.L.P.

(57) ABSTRACT

According to one embodiment, a method for manufacturing a nonvolatile semiconductor storage device includes; forming a first and a second stacked bodies; forming a through hole penetrating through the first stacked body, a second portion communicating with the first portion and penetrating through a select gate, and a third portion communicating with the second portion and penetrating through a second insulating layer; forming a memory film, a gate insulating film, and a channel body; forming a third insulating layer inside the channel body; forming a first embedded portion above a boundary portion inside the third portion; exposing the channel body by removing part of the first embedded portion and part of the third insulating layer in the third portion; and embedding a second embedded portion including silicon having higher impurity concentration than the first embedded portion above the first embedded portion inside the third portion.

5 Claims, 18 Drawing Sheets

(56) References Cited

U.S. PATENT DOCUMENTS

| | | | |
|---|---|---|---|
| 2013/0056814 A1* | 3/2013 | Higuchi | 257/314 |
| 2013/0069139 A1* | 3/2013 | Ishihara et al. | 257/324 |
| 2013/0119456 A1* | 5/2013 | Kito et al. | 257/324 |

OTHER PUBLICATIONS

U.S. Appl. No. 13/236,723, filed Sep. 20, 2011, Megumi Ishiduki, et al.

* cited by examiner

METHOD FOR MANUFACTURING NONVOLATILE SEMICONDUCTOR STORAGE DEVICE AND NONVOLATILE SEMICONDUCTOR STORAGE DEVICE

CROSS-REFERENCE TO RELATED APPLICATIONS

This application is based upon and claims the benefit of priority from the prior Japanese Patent Application No. 2011-206893, filed on Sep. 22, 2011; the entire contents of which are incorporated herein by reference.

FIELD

Embodiments described herein relate generally to a method for manufacturing nonvolatile semiconductor storage device and a nonvolatile semiconductor storage device.

BACKGROUND

Recently, a three-dimensionally stacked nonvolatile semiconductor storage device has been proposed in which multilayer conductive films are collectively processed to increase the memory storage capacity. This nonvolatile semiconductor storage device includes a structural body with insulating films and electrode films alternately stacked therein, silicon pillars penetrating through the structural body, and a memory film between the silicon pillar and the electrode film. In this structure, a memory cell is formed at the intersection between the silicon pillar and each electrode film.

The three-dimensionally stacked nonvolatile semiconductor storage device is manufactured as follows. First, memory holes penetrating through the stacked body of conductive films are formed. A charge accumulation film is formed on the sidewall of the memory hole. Then, silicon constituting a channel is formed in the memory hole.

In such a nonvolatile semiconductor storage device, improvement in the controllability of memory cells is desired.

DETAILED DESCRIPTION

Figure 1:
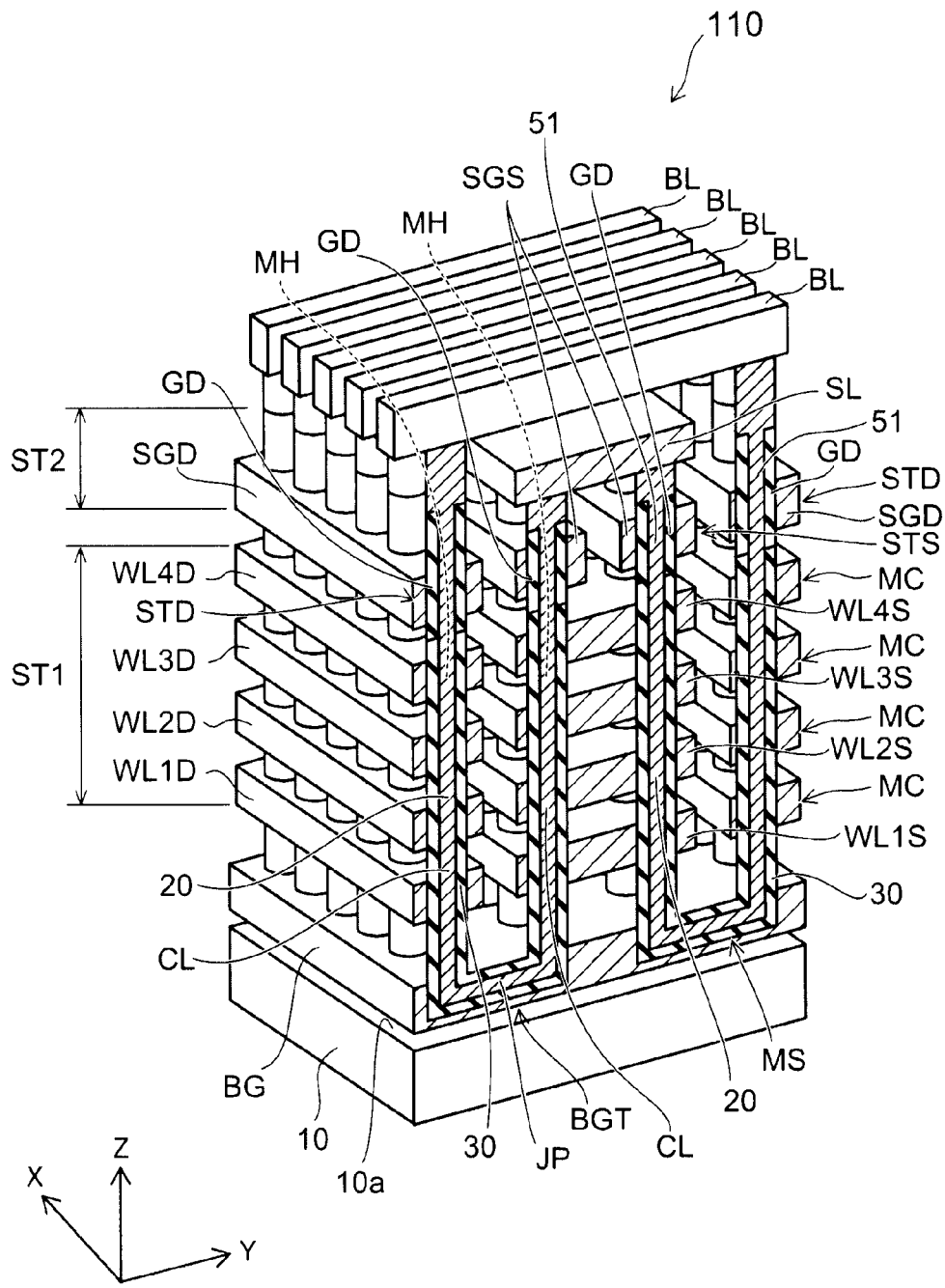
FIG. 1 is a schematic perspective view illustrating the configuration of a nonvolatile semiconductor storage device according to a first embodiment.

In general, according to one embodiment, a method for manufacturing a nonvolatile semiconductor storage device includes: forming a first stacked body and a second stacked body; forming a through hole; forming a memory film, a gate insulating film, and a channel body; forming a third insulating layer; forming a first embedded portion; exposing the channel body; and embedding a second embedded portion. The forming a first stacked body and a second stacked body includes forming a first stacked body with a plurality of electrode layers and a plurality of first insulating layers alternately stacked layer by layer on a substrate, and forming a second stacked body including a select gate and a second insulating layer above the first stacked body. The forming a through hole includes forming a through hole including a first portion penetrating through the first stacked body in stacking direction, a second portion communicating with the first portion and penetrating through the select gate in the stacking direction, and a third portion communicating with the second portion and penetrating through the second insulating layer in the stacking direction. The forming a memory film, a gate insulating film, and a channel body includes forming a memory film on a sidewall of the first portion, forming a gate insulating film on a sidewall of the second portion and a sidewall of the third portion, and forming a channel body inside the memory film and inside the gate insulating film. The forming a third insulating layer includes forming a third insulating layer including silicon oxide inside the channel body and occluding with the third insulating layer a boundary portion between the second portion and the third portion in the through hole. The forming a first embedded portion includes forming a first embedded portion including silicon above the boundary portion inside the third portion. The exposing the channel body includes exposing the channel body by removing part of the first embedded portion and part of the third insulating layer in the third portion. The embedding a second embedded portion includes embedding a second embedded portion including silicon having higher impurity concentration than the first embedded portion above the first embedded Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

(First Embodiment)

FIG. 1 is a schematic perspective view illustrating the configuration of a nonvolatile semiconductor storage device according to a first embodiment.

More specifically, FIG. 1 shows a schematic perspective view in which the nonvolatile semiconductor storage device is partially cut away. In FIG. 1, for clarity of illustration, part of the insulating portion is not shown.

Figure 2:
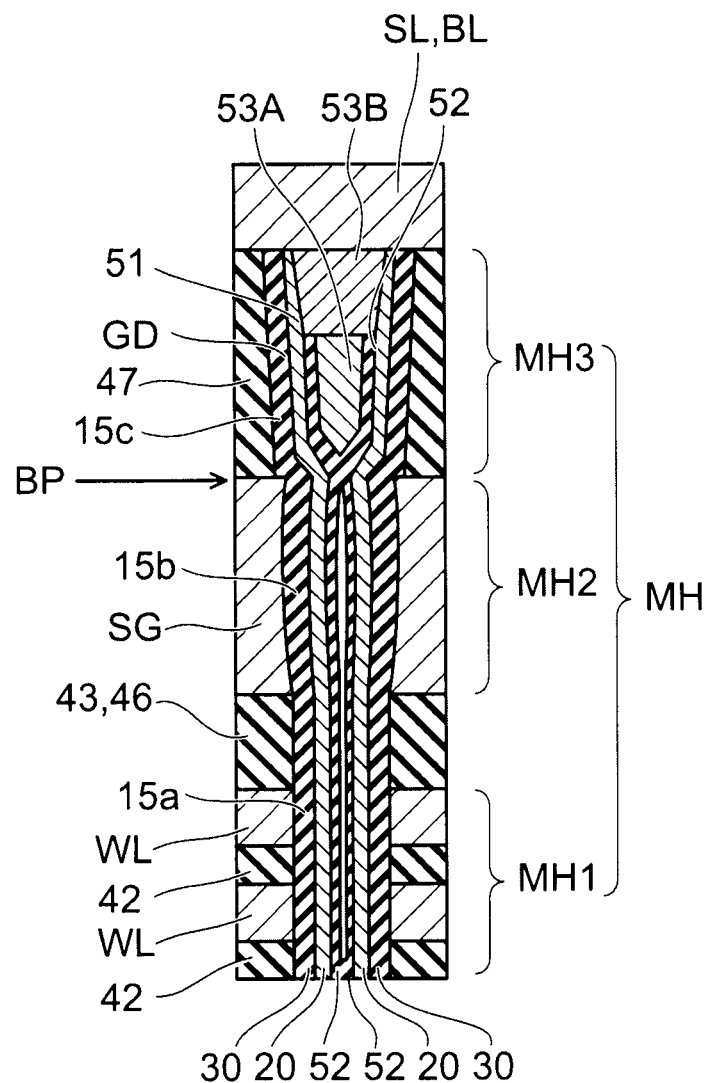
FIG. 2 is a schematic enlarged sectional view of the select gate portion.

FIG. 2 is a schematic enlarged sectional view of the select gate portion.

Figure 3:
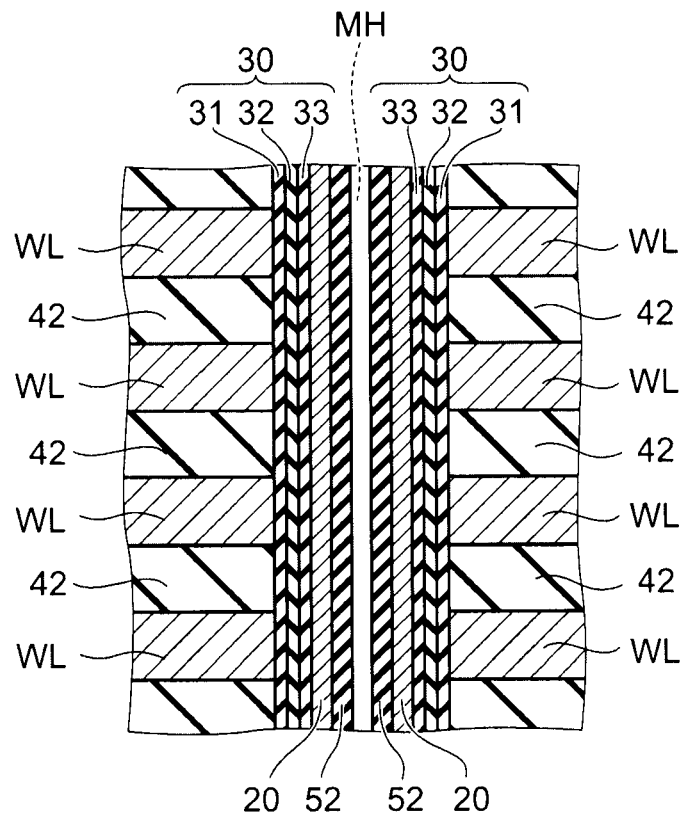
FIG. 3 is a schematic enlarged sectional view of the memory cell portion.

FIG. 3 is a schematic enlarged sectional view of the memory cell portion.

Figure 4:
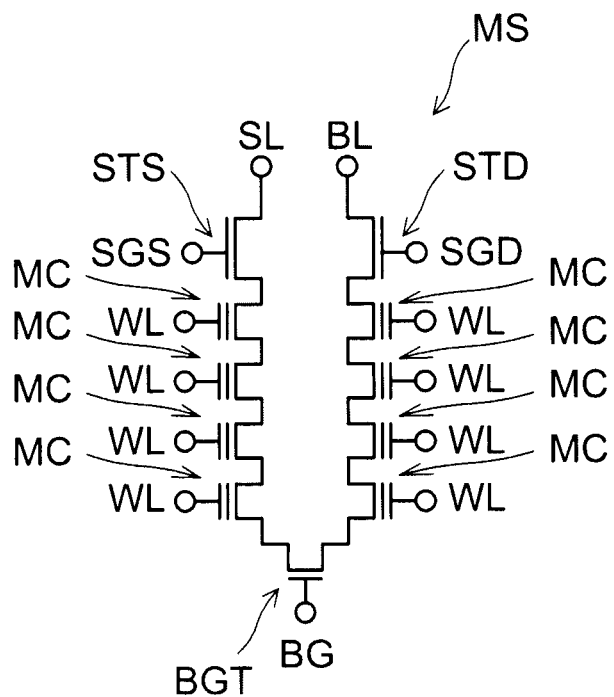
FIG. 4 is a circuit diagram of the memory string.

FIG. 4 is a circuit diagram of the memory string.

First, a brief overview of the nonvolatile semiconductor storage device 110 according to the embodiment is described.

For convenience of description, an XYZ orthogonal coordinate system is herein introduced. In this coordinate system, the directions being parallel to the major surface 10a of the substrate 10 and directed along the two axes orthogonal to each other are referred to as X-axis and Y-axis directions. The direction along the axis orthogonal to both these X-axis and Y-axis directions is referred to as Z-axis direction. The direction away from the major surface 10a of the substrate 10 along the Z axis is referred to by using such terms as upward, upper side, above, and top. The opposite direction is referred to by using such terms as downward, lower side, below, and bottom. The partial cross section shown in FIG. 1 corresponds to a cross section in the Y-axis direction.

As shown in FIGS. 1 to 3, the nonvolatile semiconductor storage device 110 includes a first stacked body ST1, a second stacked body ST2, a memory film 30, a gate insulating film GD, a channel body (first channel body 20 and second channel body 51), a third insulating layer 52, a first embedded portion 53A, and a second embedded portion 53B.

The first stacked body ST1 includes a structure in which a plurality of insulating layers 42 (first insulating layers) are alternately stacked layer by layer with a plurality of electrode layers WL1D, WL2D, WL3D, WL4D, WL1S, WL2S, WL3S, and WL4S. The stacking direction is the Z-axis direction.

The second stacked body ST2 includes a structure in which a select gate SG (source side select gate SGS and drain side select gate SGD) and a second insulating layer 47 are stacked.

In the first stacked body ST1 and the second stacked body ST2, memory holes MH (through holes) penetrating through the first stacked body ST1 and the second stacked body ST2 along the Z-axis direction are provided.

As shown in FIG. 2, the memory hole MH includes a first portion MH1, a second portion MH2, and a third portion MH3. The first portion MH1 is a portion penetrating through the first stacked body ST1. The second portion MH2 is a portion communicating with the first portion MH1 and penetrating through the select gate SG. The third portion MH3 is a portion communicating with the second portion MH2 and penetrating through the second insulating layer 47.

On the sidewall 15a of the first portion MH1, a memory film 30 is provided. On the sidewall 15b of the second portion MH2 and the sidewall 15c of the third portion MH3, a gate insulating film GD is provided.

Inside the gate insulating film GD and the memory film 30 in the memory hole MH, a channel body (first channel body 20 and second channel body 51) is provided. The first channel body 20 includes a semiconductor layer penetrating through the first stacked body ST1. The second channel body 51 includes a semiconductor layer penetrating through the second stacked body ST2. The first channel body 20 and the second channel body 51 are continuously provided.

Inside the second channel body 51 in the memory hole MH, a third insulating layer 52 is provided. The third insulating layer 52 includes silicon oxide. The third insulating layer 52 is provided so as to occlude the boundary portion BP between the second portion MH2 and the third portion MH3 in the memory hole MH.

Above the boundary portion BP in the third portion MH3, a first embedded portion 53A including silicon is provided. Above the first embedded portion 53A in the third portion MH3, a second embedded portion 53B is provided.

The second embedded portion 53B is in contact with the second channel body 51. The second embedded portion 53B includes silicon having higher impurity concentration than the first embedded portion 53A. The first embedded portion 53A is made of e.g. polycrystalline silicon not doped with impurity. The second embedded portion 53B is made of e.g. polycrystalline silicon doped with impurity.

Next, a specific configuration example of the nonvolatile semiconductor storage device 110 is described.

As shown in FIG. 1, above the substrate 10, a back gate BG is provided via an insulating layer, not shown. The back gate BG is e.g. a silicon layer doped with impurity and made conductive.

Above the back gate BG, a plurality of insulating layers 42 (see FIG. 2) are alternately stacked with a plurality of electrode layers WL1D, WL2D, WL3D, WL4D, WL1S, WL2S, WL3S, and WL4S.

The electrode layer WL1D and the electrode layer WL1S are provided at the same level and represent a first electrode layer from the bottom. The electrode layer WL2D and the electrode layer WL2S are provided at the same level and represent a second electrode layer from the bottom. The electrode layer WL3D and the electrode layer WL3S are provided at the same level and represent a third electrode layer from the bottom. The electrode layer WL4D and the electrode layer WL4S are provided at the same level and represent a fourth electrode layer from the bottom.

The electrode layer WL1D and the electrode layer WL1S are divided in the Y-axis direction. The electrode layer WL2D and the electrode layer WL2S are divided in the Y-axis direction. The electrode layer WL3D and the electrode layer WL3S are divided in the Y-axis direction. The electrode layer WL4D and the electrode layer WL4S are divided in the Y-axis direction.

An insulating film 45 shown in FIGS. 7B to 8B is provided between the electrode layer WL1D and the electrode layer WL1S, between the electrode layer WL2D and the electrode layer WL2S, between the electrode layer WL3D and the electrode layer WL3S, and between the electrode layer WL4D and the electrode layer WL4S.

The electrode layers WL1D-WL4D are provided between the back gate BG and the drain side select gate SGD. The electrode layers WL1S-WL4S are provided between the back gate BG and the source side select gate SGS.

The number of electrode layers is arbitrary, and is not limited to four as illustrated in FIG. 1. In the following description, the electrode layers WL1D-WL4D and WL1S-WL4S may be collectively and simply referred to as electrode layer WL.

The electrode layer WL is e.g. a silicon layer doped with impurity and made conductive. The electrode layer WL is e.g. a polycrystalline silicon layer doped with impurity such as boron. The insulating layer 42 is e.g. a TEOS (tetraethoxysilane) layer including silicon oxide.

Above the electrode layer WL4D, a drain side select gate SGD is provided. The drain side select gate SGD is e.g. a silicon layer doped with impurity and made conductive. The drain side select gate SGD is e.g. a polycrystalline silicon layer doped with impurity such as boron.

Above the electrode layer WL4S, a source side select gate SGS is provided. The source side select gate SGS is e.g. a silicon layer doped with impurity and made conductive. The source side select gate SGS is e.g. a polycrystalline silicon layer doped with impurity such as boron.

The drain side select gate SGD and the source side select gate SGS are divided in the Y-axis direction. In the following description, the drain side select gate SGD and the source side select gate SGS may be simply referred to as select gate SG without distinction.

Above the source side select gate SGS, a source line SL is provided. The source line SL is e.g. a metal layer.

Above the drain side select gate SGD and the source line SL, a plurality of bit lines BL are provided. Each bit line BL extends in the Y-axis direction.

In the back gate BG and the first stacked body ST1 above this back gate BG, a plurality of U-shaped memory holes MH are formed. In the electrode layers WL1D-WL4D and the drain side select gate SGD, holes penetrating therethrough and extending in the Z-axis direction are formed. In the electrode layers WL1S-WL4S and the source side select gate SGS, holes penetrating therethrough and extending in the Z-axis direction are formed. A pair of the holes extending in the Z-axis direction are joined via a recess 81 (shown in FIG. 6B) formed in the back gate BG to constitute a U-shaped memory hole MH.

Inside the memory hole MH, a first channel body 20 and a second channel body 51 are provided. The first channel body 20 and the second channel body 51 are e.g. silicon films.

A memory film 30 is provided between the first channel body 20 and the inner wall of the memory hole MH.

A gate insulating film GD is provided between the drain side select gate SGD and the second channel body 51, and between the source side select gate SGS and the second channel body 51.

In FIG. 1, the channel body is not limited to the structure of being embedded in the entire memory hole MH. The channel body may be formed so as to leave a void on the central axis side of the memory hole MH. Alternatively, an insulator may be embedded in the void inside the channel body.

In the memory cell transistor (hereinafter also simply referred to as memory cell MC), a memory film 30 is provided between each electrode layer WL and the first channel body 20. As shown in FIG. 3, the memory film 30 includes, sequentially from the electrode layer WL side, a block film 31 as a first insulating film, a charge accumulation film 32, and a tunnel film 33 as a second insulating film. The block film 31 is in contact with the electrode layer WL. The tunnel film 33 is in contact with the first channel body 20. The charge accumulation film 32 is provided between the block film 31 and the tunnel film 33.

The first channel body 20 functions as a channel in the memory cell transistor. The electrode layer WL functions as a control gate. The charge accumulation film 32 functions as a data storage layer for accumulating charge injected from the first channel body 20. That is, a memory cell MC is formed at the intersection between the first channel body 20 and each electrode layer WL. The memory cell MC has a structure in which the channel is surrounded with the control gate.

The memory cell MC is an information storage region of e.g. the charge trap type. The charge accumulation film 32 includes a large number of trap sites for trapping charge. The charge accumulation film 32 is e.g. a silicon nitride film.

The tunnel film 33 is e.g. a silicon oxide film. The tunnel film 33 serves as a potential barrier when a charge is injected from the first channel body 20 into the charge accumulation film 32, or when the charge accumulated in the charge accumulation film 32 is diffused into the first channel body 20.

The block film 31 is e.g. a silicon oxide film. The block film 31 prevents the charge accumulated in the charge accumulation film 32 from diffusing into the electrode layer WL.

The memory film 30 has e.g. an ONO (oxide-nitride-oxide) structure in which a silicon nitride film (charge accumulation film 32) is sandwiched between a pair of silicon oxide films (block film 31 and tunnel film 33).

The drain side select gate SGD, the second channel body 51, and the gate insulating film GD therebetween constitute a drain side select transistor STD. The second channel body 51 in the drain side select transistor STD is connected to a bit line BL.

The source side select gate SGS, the second channel body 51, and the gate insulating film GD therebetween constitute a source side select transistor STS. The second channel body 51 in the source side select transistor STS is connected to a source line SL.

In the following description, the drain side select transistor STD and the source side select transistor STS may be simply referred to as select transistor ST without distinction.

The back gate BG, the first channel body 20 provided in this back gate BG, and the memory film 30 constitute a back gate transistor BGT.

Between the drain side select transistor STD and the back gate transistor BGT, a plurality of memory cells MC with the electrode layers WL4D-WL1D serving as control gates are provided. Likewise, also between the back gate transistor BGT and the source side select transistor STS, a plurality of memory cells MC with the electrode layers WL1S-WL4S serving as control gates are provided.

The plurality of memory cells MC, the drain side select transistor STD, the back gate transistor BGT, and the source side select transistor STS are series connected via the first channel body 20 and the second channel body 51 to constitute one U-shaped memory string MS.

As shown in FIG. 4, one memory string MS has a circuit configuration in which a plurality of memory cells MC are series connected between the source line SL and the bit line BL. The source side select transistor STS is connected between the source line SL and the memory cell MC on the source line side. The drain side select transistor STD is connected between the bit line BL and the memory cell MC on the bit line side. The back gate transistor BGT is connected at the center of the U-shaped memory string MS.

One memory string MS includes a pair of columnar portions CL extending in the stacking direction of the stacked body (e.g., first stacked body ST1) including a plurality of electrode layers WL, and a joining portion JP embedded in the back gate BG and joining the lower ends of the pair of columnar portions CL. A plurality of the memory strings MS are arranged in the X-axis and Y-axis directions. Thus, a plurality of memory cells MC are provided three-dimensionally in the X-axis, Y-axis, and Z-axis directions.

A plurality of memory strings MS are provided in the memory cell array region on the substrate 10. A peripheral circuit for controlling the memory cell array is provided e.g. around the memory cell array region on the substrate 10.

In the nonvolatile semiconductor storage device 110, the third insulating layer 52 including silicon oxide is provided inside the first channel body 20 and the second channel body 51. Thus, in the nonvolatile semiconductor storage device 110, charge trap is reduced as compared with the case where an insulating layer including silicon nitride is provided inside the first channel body 20 and the second channel body 51. In the nonvolatile semiconductor storage device 110, variation in the current-voltage characteristics of memory cells MC due to charge trap is suppressed. Hence, the transistor characteristics of the memory cells MC are stabilized.

Furthermore, the first embedded portion 53A embedded in the third portion MH3 is made of a material (e.g., non-doped polycrystalline silicon) having lower impurity concentration than the second embedded portion 53B. Thus, the performance of embedding into the third portion MH3 is improved. This improves the controllability of etch-back of the first embedded portion 53A performed in the manufacturing process. Thus, the second embedded portion 53B is made closer to the select gate SG. This suppresses the parasitic resistance between the wiring (bit line BL and source line SL) and the select transistor ST. Thus, in the nonvolatile semiconductor storage device 110, the controllability of memory cells MC is improved.

Next, a method for manufacturing the nonvolatile semiconductor storage device 110 according to the embodiment is described.

Figure 5:
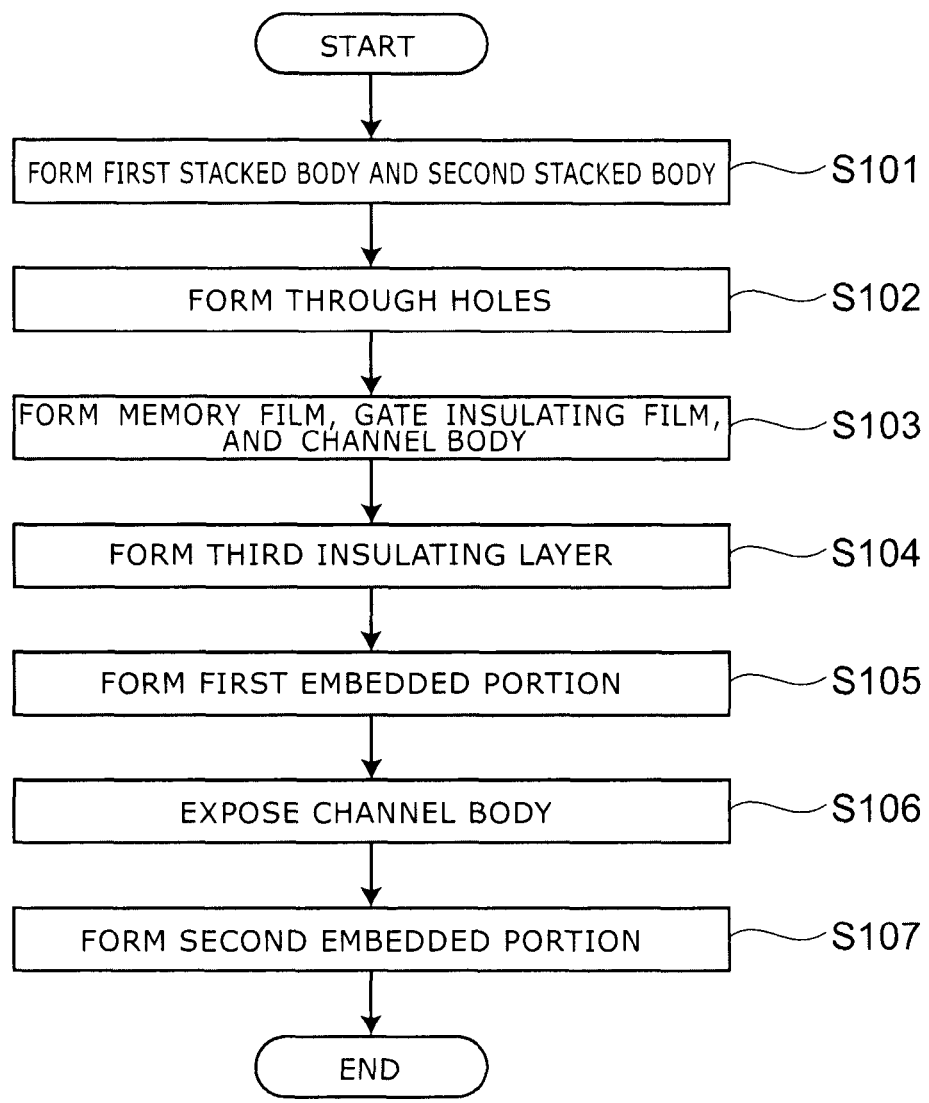
FIG. 5 is a flow chart illustrating the manufacturing method.

FIG. 5 is a flow chart illustrating the manufacturing method.

The method for manufacturing the nonvolatile semiconductor storage device 110 includes forming a first stacked body and a second stacked body (step S101), forming through holes (step S102), forming a memory film, a gate insulating film, and a channel body (step S103), forming a third insulating layer (step S104), forming a first embedded portion (step S105), exposing the channel body (step S106), and forming a second embedded portion (step S107).

Next, a specific example of the manufacturing method is described.

FIGS. 6A to 12 are schematic cross sectional views illustrating the method for manufacturing a nonvolatile semiconductor storage device.

Figure 6A:
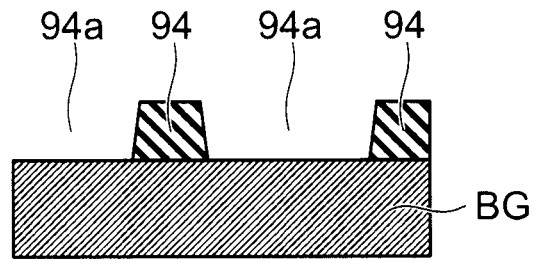
FIGS. 6A to 12 are schematic sectional views illustrating the method for manufacturing a nonvolatile semiconductor storage device.

Above the substrate 10, a back gate BG is provided via an insulating layer, not shown. The back gate BG is e.g. a polycrystalline silicon layer doped with impurity such as boron. Above the back gate BG, as shown in FIG. 6A, a resist 94 is formed. The resist 94 is patterned and includes a selectively formed opening 94a.

Figure 6B:
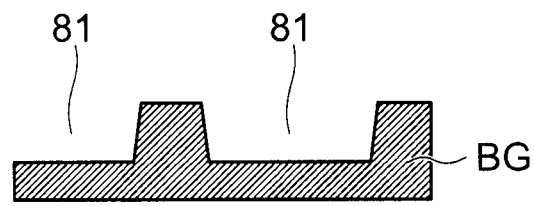

Next, the resist 94 is used as a mask to selectively dry etch the back gate BG. Thus, as shown in FIG. 6B, a recess 81 is formed in the back gate BG.

Figure 6C:
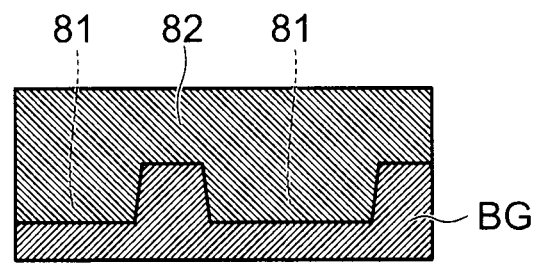
Figure 6D:
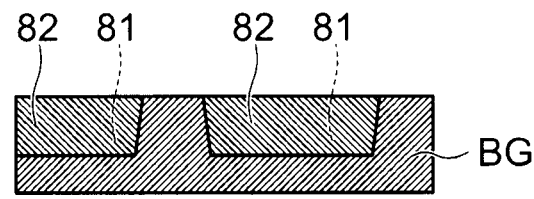

Next, as shown in FIG. 6C, a sacrificial film 82 is embedded in the recess 81. The sacrificial film 82 is e.g. a silicon nitride film or non-doped silicon film. Subsequently, the sacrificial film 82 is subjected to entire surface etching to expose the surface of the back gate BG between the recesses 81 as shown in FIG. 6D.

Figure 7A:
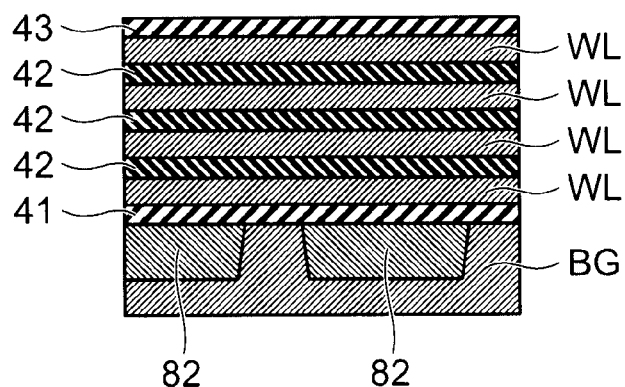

Next, as shown in FIG. 7A, above the back gate BG, an insulating film 41 is formed. Then, above the insulating film 41, a first stacked body ST1 including a plurality of electrode layers WL and a plurality of insulating layers 42 is formed. The electrode layers WL and the insulating layers 42 are alternately stacked. The insulating layer 42 is interposed between the electrode layers WL. Above the uppermost electrode layer WL, an insulating film 43 is formed. For convenience, the first stacked body ST1 may include the insulating films 41 and 43.

Next, by photolithography and etching, the first stacked body ST1 is divided to form a trench reaching the insulating film 41. Then, as shown in FIG. 7B, the trench is embedded with a fourth insulating film 45.

After embedding the trench with the fourth insulating film 45, the insulating film 43 is exposed by entire surface etching. Above the insulating film 43, as shown in FIG. 7C, an insulating film 46 is formed. Furthermore, above the insulating film 46, a second stacked body ST2 including a select gate SG and an insulating layer 47 is formed. More specifically, the select gate SG is formed above the insulating film 46, and the insulating layer 47 is formed above the select gate SG. For convenience, the second stacked body ST2 may include the insulating film 46.

Figure 7B:
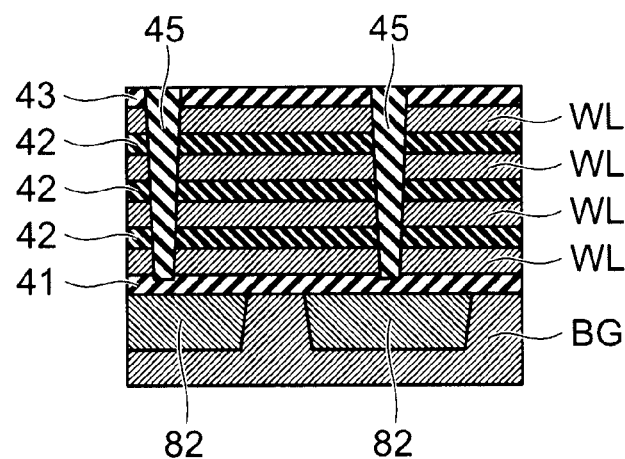
Figure 7C:
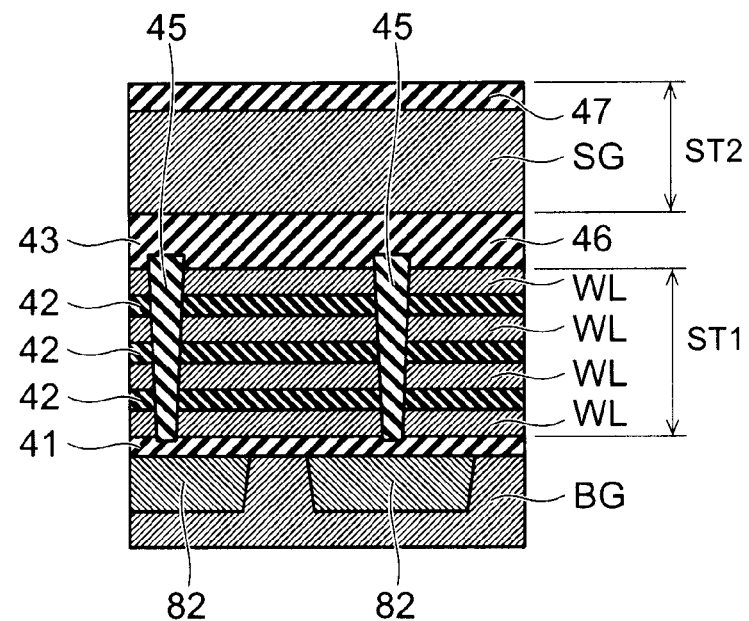

The process shown in FIGS. 7A to 7C is an example of step S101 shown in FIG. 5.

Figure 8A:
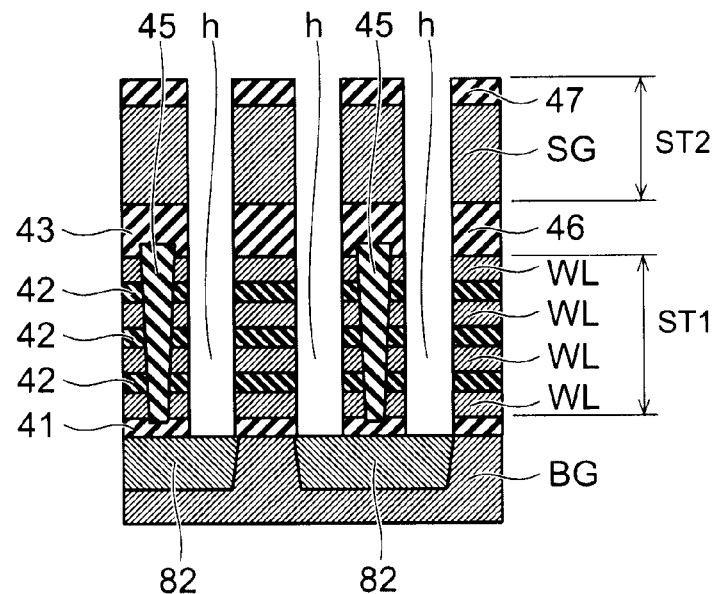

Next, as shown in FIG. 8A, holes h are formed in the first stacked body ST1 and the second stacked body ST2 above the back gate BG. The holes h are formed by e.g. the RIE (reactive ion etching) method using a mask, not shown. The lower end of the hole h reaches the sacrificial film 82. The sacrificial film 82 is exposed at the bottom of the hole h. A pair of holes h are located above one sacrificial film 82 so as to sandwich the fourth insulating film 45 located generally at the center of the sacrificial film 82.

Next, the sacrificial film 82 is removed through the hole h by e.g. wet etching. The etching liquid that can be used at this time is e.g. an alkaline chemical such as a KOH (potassium hydroxide) solution, or a phosphoric acid ($H_3PO_4$) solution with the etching rate adjusted by the temperature condition.

Figure 8B:
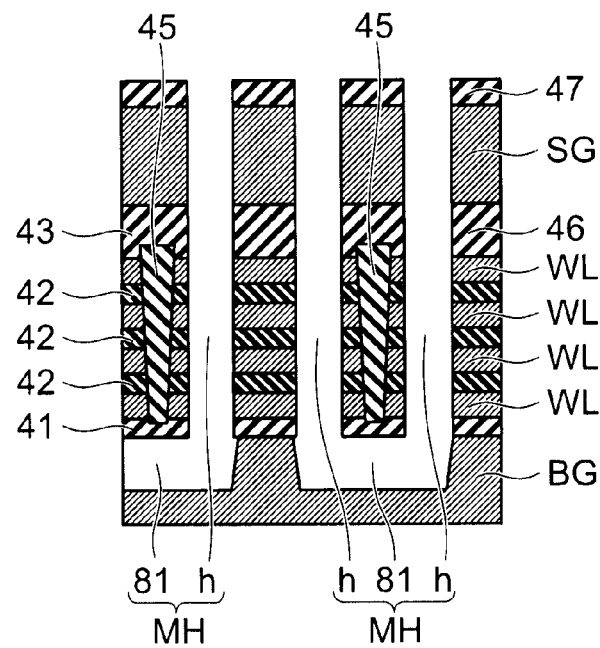

Thus, as shown in FIG. 8B, the sacrificial film 82 is removed. By the removal of the sacrificial film 82, a recess 81 is formed in the back gate BG. To one recess 81, a pair of holes h are joined. More specifically, the lower ends of a pair of holes h are joined to one common recess 81 to form one U-shaped memory hole MH.

The process shown in FIGS. 8A and 8B is an example of step S102 shown in FIG. 5.

On the second stacked body in the memory hole MH, the process illustrated in FIGS. 9A to 12 is performed.

First, in the process illustrated above, a memory hole MH as shown in FIG. 9A is formed. Then, natural oxide film formed on the surface of the electrode layer WL and the select gate SG exposed in the memory hole MH is removed with e.g. hydrofluoric acid. By the treatment with e.g. hydrofluoric acid, the hole diameter φ3 of the third portion MH3 is made larger than the hole diameter φ2 of the second portion MH2. Between the second portion MH2 and the third portion MH3, a step difference of e.g. approximately 5 nanometers (nm) is provided.

Figure 9A:
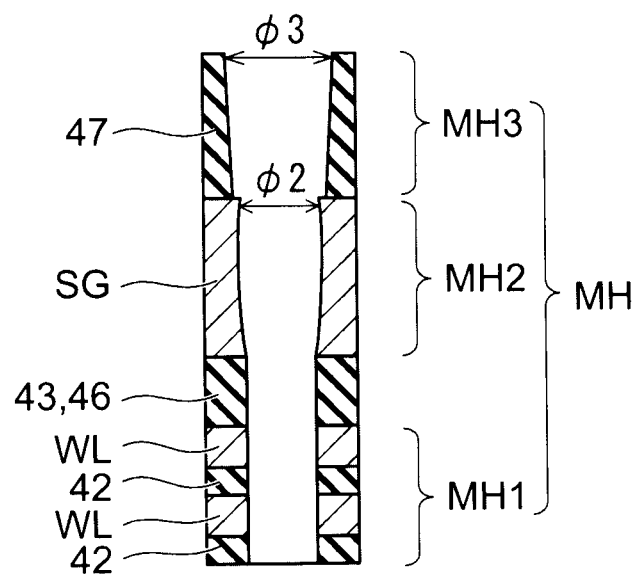
Figure 9B:
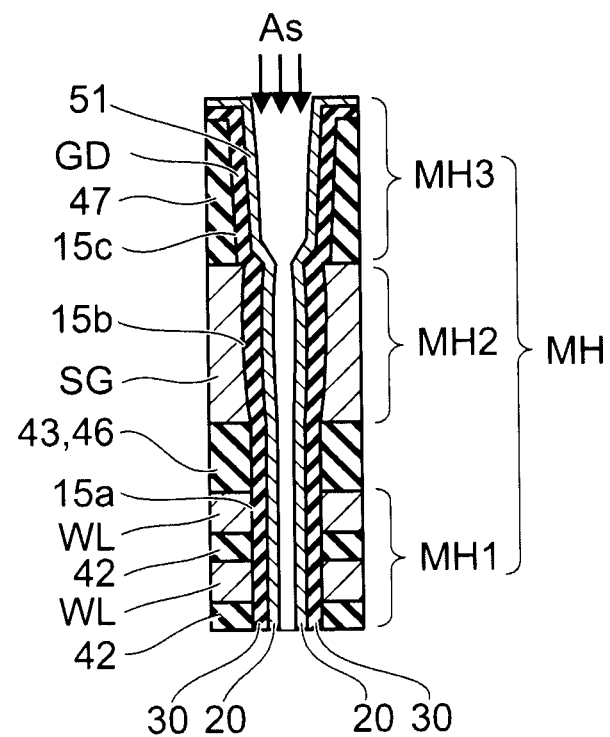

Next, as shown in FIG. 9B, in the memory hole MH, a gate insulating film GD is formed on the sidewall 15b of the second portion MH2 and the sidewall 15c of the third portion MH3. A memory film 30 is formed on the sidewall 15a of the first portion MH1.

Furthermore, inside the gate insulating film GD and the memory film 30, a first channel body 20 and a second channel body 51 are formed. The first channel body 20 and the second channel body 51 are e.g. polycrystalline silicon films. The first channel body 20 and the second channel body 51 are formed by e.g. the CVD (chemical vapor deposition) method.

The process shown in FIG. 9B is an example of step S103 shown in FIG. 5.

Subsequently, ion implantation of e.g. arsenic is performed on the second channel body 51 (e.g., polycrystalline silicon film) at the step difference between the second portion MH2 and the third portion MH3.

Figure 10A:
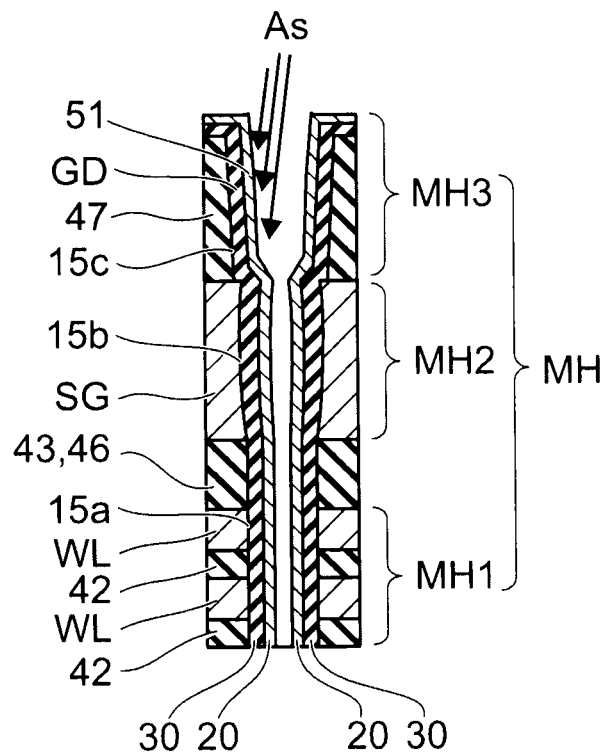

Next, as shown in FIG. 10A, ion implantation of e.g. arsenic is performed on the second channel body 51 of the third portion MH3. Ions are implanted at an angle of e.g. 5 degrees with respect to the Z axis.

Figure 10B:
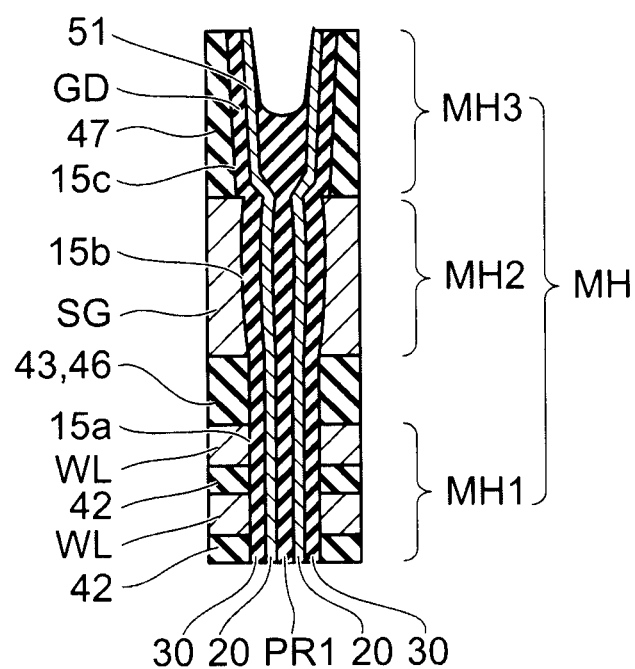

Next, as shown in FIG. 10B, a photoresist PR1 is applied into the memory hole MH and etched back halfway through the third portion MH3. Then, a portion of the second channel body 51 above the photoresist PR1 (at the open end portion of the memory hole MH) is removed. Then, the shoulder portion of the second channel body 51 (polycrystalline silicon) provided on the upper end sidewall of the third portion MH3 is removed. For instance, it is known that application of heat to polycrystalline silicon doped with impurity results in its volume expansion. At the open end portion of the memory hole MH, the second channel body 51 expands and is shaped like an overhang. By removing this overhang, the performance of embedding a material into the memory hole MH in the subsequent process is improved.

Figure 11A:
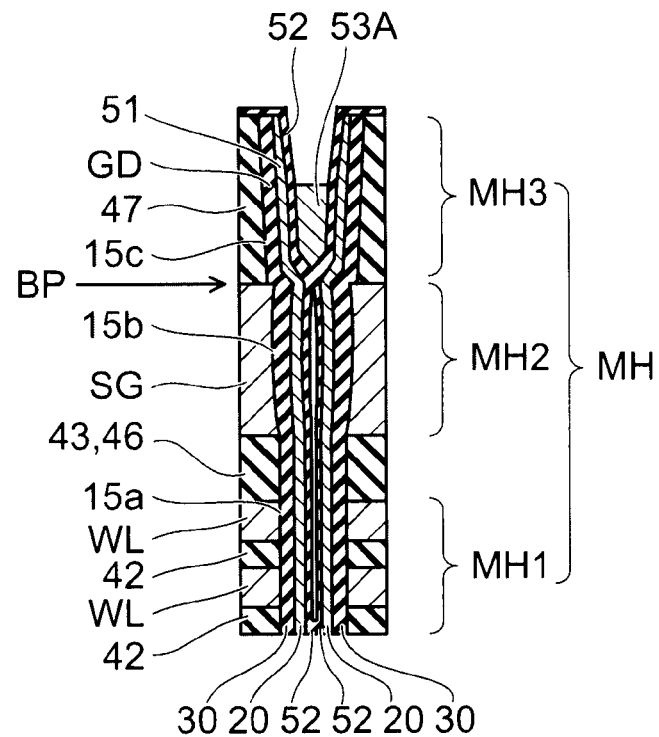

Next, as shown in FIG. 11A, the second channel body 51 on the surface of the second insulating layer 47 are removed. Subsequently, inside the first channel body 20 and the second channel body 51 in the memory hole MH, a third insulating layer 52 is formed. The third insulating layer 52 includes silicon oxide. The third insulating layer 52 is formed by e.g. the ALD (atomic layer deposition) method. The third insulating layer 52 is formed until the boundary portion BP between the second portion MH2 and the third portion MH3 in the memory hole MH is occluded with the third insulating layer 52.

Subsequently, above the boundary portion BP inside the third portion MH3, a first embedded portion 53A is embedded and etched back halfway. The first embedded portion 53A includes e.g. non-doped polycrystalline silicon. The first embedded portion 53A is formed by e.g. the CVD method.

The process shown in FIG. 11A is an example of steps S104-S105 shown in FIG. 5.

Figure 11B:
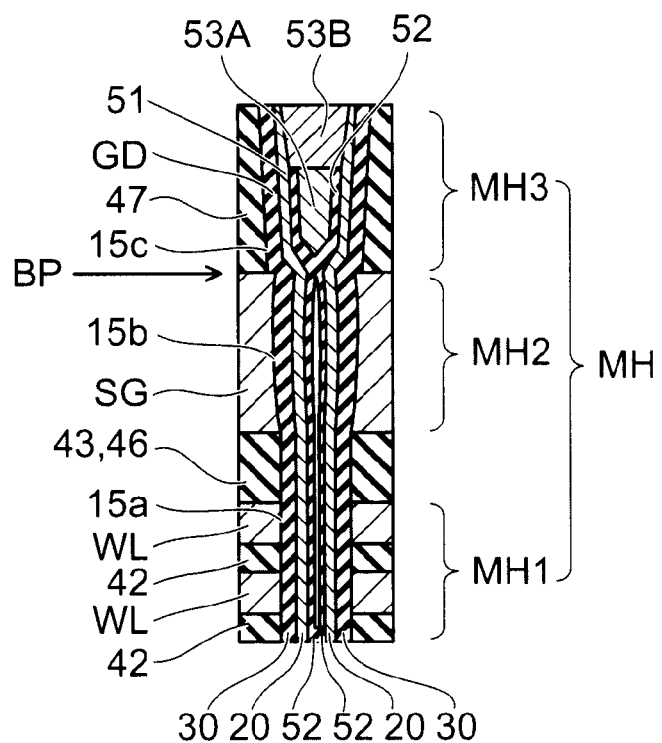

Next, as shown in FIG. 11B, part of the third insulating layer 52 in the third portion MH3 is removed to expose the second channel body 51. For instance, by isotropic etching with hydrofluoric acid, the third insulating layer 52 above the first embedded portion 53A is removed. Thus, the second channel body 51 is exposed. This etching is performed with an etchant such that the etching rate of the third insulating layer 52 is faster than the etching rate of the first embedded portion 53A. Thus, the exposed third insulating layer 52 is removed, whereas the third insulating layer 52 covered with the first embedded portion 53A is left.

Next, above the first embedded portion 53A inside the third portion MH3, a second embedded portion 53B is embedded and etched back. The second embedded portion 53B includes e.g. polycrystalline silicon doped with phosphorus. The second embedded portion 53B is formed by e.g. the CVD method. The second embedded portion 53B is in contact with the second channel body 51 exposed in the third portion MH3. The second embedded portion 53B electrically connects the second channel body 51 to a metal wiring (source line SL, bit line BL) formed subsequently.

The process shown in FIG. 11B is an example of steps S106-S107 shown in FIG. 5.

Figure 12:
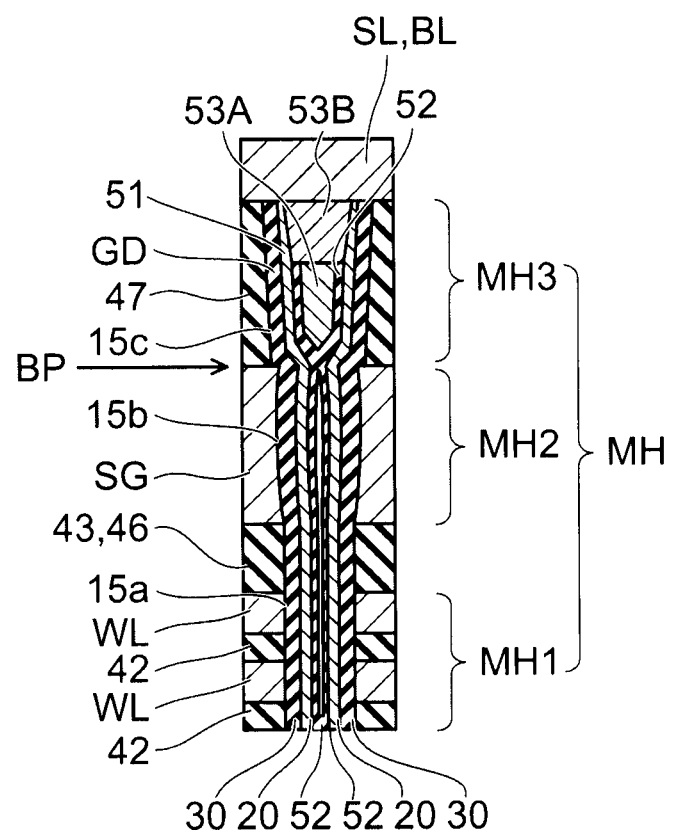

Subsequently, as shown in FIG. 12, above the second embedded portion 53B, a source line SL or bit line BL as a metal wiring is formed.

In the manufacturing method according to the embodiment, in the memory hole MH, a first channel body 20 and a second channel body 51 shaped like a cylinder are formed. At the core thereof, a third insulating layer 52 including silicon oxide is provided. The silicon oxide film is a film including fewer charge traps than the silicon nitride film. Accordingly, the third insulating layer 52 thus provided suppresses variation in the current-voltage characteristics due to charge trap. Hence, the transistor characteristics of memory cells MC are stabilized.

The impurity concentration of the first embedded portion 53A is lower than the impurity concentration of the second embedded portion 53B. The non-doped polycrystalline silicon, for instance, used for the first embedded portion 53A has higher embedding performance than the silicon nitride film. Thus, the depth controllability in etching back the first embedded portion 53A is high. The second embedded portion 53B is made closer to the select gate SG. This suppresses the parasitic resistance between the bit line BL and source line SL on one hand and the select transistor ST on the other. Thus, the controllability of memory cells MC is improved.

(Second Embodiment)

Figure 13:
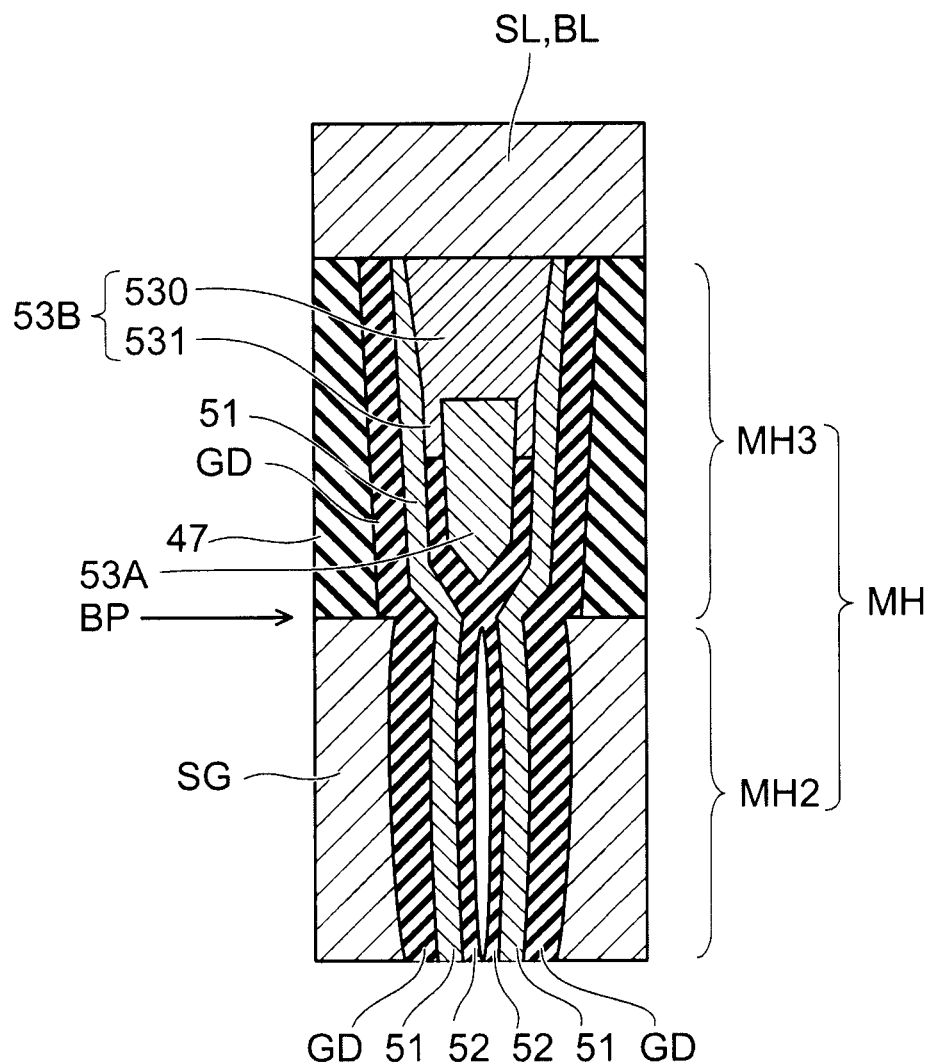
FIG. 13 is a schematic sectional view illustrating the configuration of a nonvolatile semiconductor storage device according to a second embodiment.

FIG. 13 is a schematic sectional view illustrating the configuration of a nonvolatile semiconductor storage device according to a second embodiment.

More specifically, FIG. 13 shows a schematic enlarged view of the select gate portion of the nonvolatile semiconductor storage device.

As shown in FIG. 13, the second embedded portion 53B of the nonvolatile semiconductor storage device 120 according to the second embodiment includes a connecting portion 530 and an extending portion 531. The extending portion 531 is a portion extending downward from the connecting portion 530. The connecting portion 530 is provided between the first embedded portion 53A on one hand and the source line SL and bit line BL on the other. The extending portion 531 is provided between the first embedded portion 53A and the third insulating layer 52.

In the nonvolatile semiconductor storage device 120 according to the second embodiment, the extending portion 531 is provided. Thus, the contact area between the second embedded portion 53B and the second channel body 51 is larger than in the nonvolatile semiconductor storage device 110 according to the first embodiment. Hence, in the nonvolatile semiconductor storage device 120, the parasitic resistance between the source line SL and bit line BL on one hand and the second channel body 51 on the other is suppressed. Thus, the controllability of memory cells MC is improved.

Next, a method for manufacturing the nonvolatile semiconductor storage device 120 according to the embodiment is described.

Figure 14A:
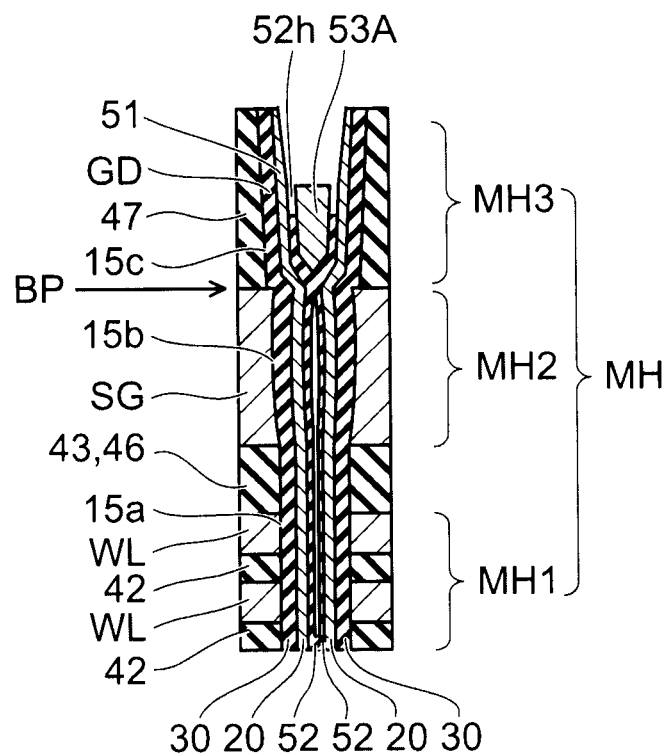
FIGS. 14A to 18B are schematic sectional views illustrating the method for manufacturing a nonvolatile semiconductor storage device.
Figure 14B:
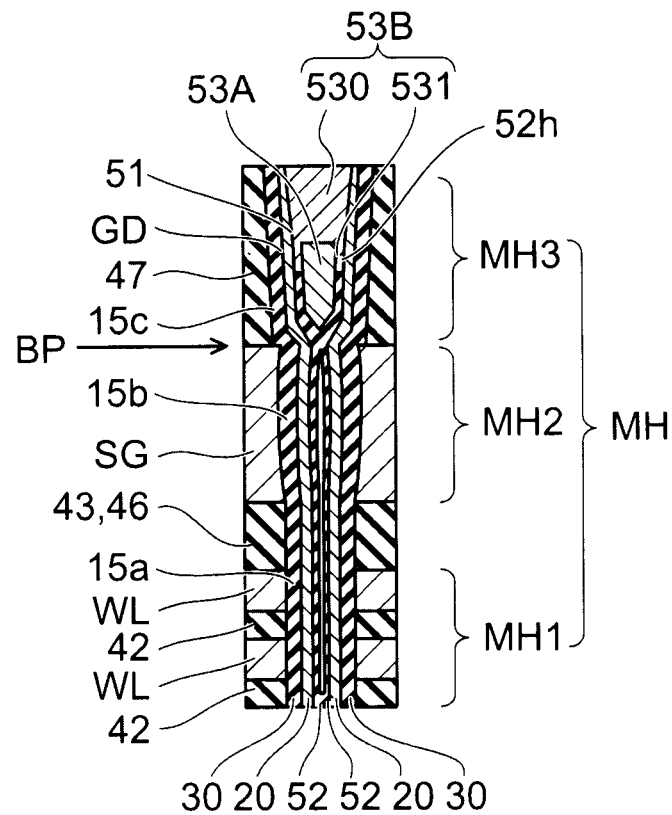
Figure 15:
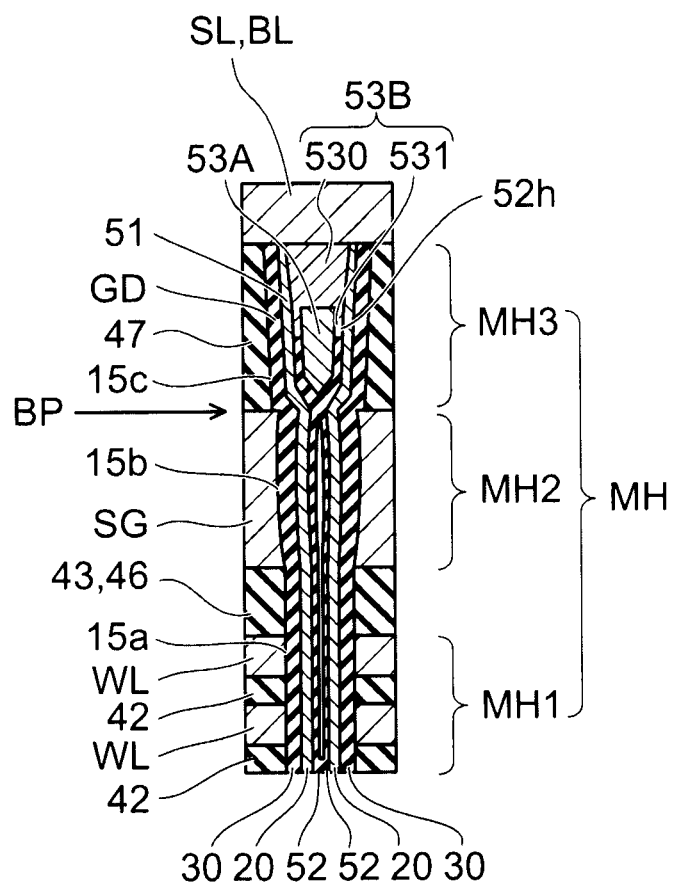

FIGS. 14A to 15 are schematic cross sectional views illustrating the method for manufacturing a nonvolatile semiconductor storage device.

In the method for manufacturing the nonvolatile semiconductor storage device 120, the processing illustrated in FIGS. 6A to 10B is the same as the process of the method for manufacturing the nonvolatile semiconductor storage device 110 according to the first embodiment.

Next, as shown in FIG. 14A, part of the third insulating layer 52 in the third portion MH3 is removed to expose the second channel body 51. For instance, by isotropic etching with hydrofluoric acid, the third insulating layer 52 at least above the first embedded portion 53A is removed. Thus, the second channel body 51 is exposed.

In this etching, by adjusting the etching condition, part of the third insulating layer 52 between the first embedded portion 53A and the second channel body 51 is also removed. For instance, by adjusting the etching time, the third insulating layer 52 is etched to a position below the upper surface of the first embedded portion 53A. By this etching, the third insulating layer 52 is set back from the surface of the first embedded portion 53A. That is, a recess 52h is formed in the portion between the first embedded portion 53A and the second channel body 51 where the third insulating layer 52 has been removed.

Next, as shown in FIG. 14B, above the first embedded portion 53A and in the recess 52h inside the third portion MH3, a second embedded portion 53B is embedded. Inside the third portion MH3, the second embedded portion 53B formed above the first embedded portion 53A constitutes a connecting portion 530. The second embedded portion 53B embedded in the recess 52h constitutes an extending portion 531.

The depth of the extending portion 531 along the Z-axis direction is determined by the depth of the recess 52h. The depth of the recess 52h is specified by the etching condition of the third insulating layer 52. Hence, the depth of the extending portion 531 is specified by the etching condition of the third insulating layer 52.

Subsequently, as shown in FIG. 15, above the second embedded portion 53B, a source line SL or bit line BL as a metal wiring is formed.

In the manufacturing method according to the embodiment, the depth of the extending portion 531 is specified by the etching condition of the third insulating layer 52. Thus, a nonvolatile semiconductor storage device 120 is provided in which the parasitic resistance between the source line SL and bit line BL on one hand and the second channel body 51 on the other is suppressed.

(Third Embodiment)

Next, a method for manufacturing a nonvolatile semiconductor storage device according to a third embodiment is described.

FIGS. 16A to 18B are schematic sectional views illustrating the method for manufacturing a nonvolatile semiconductor storage device according to the third embodiment.

In the method for manufacturing a nonvolatile semiconductor storage device according to the third embodiment, the processing illustrated in FIGS. 6A to 9A is the same as the process of the method for manufacturing the nonvolatile semiconductor storage device 110 according to the first embodiment.

Figure 16A:
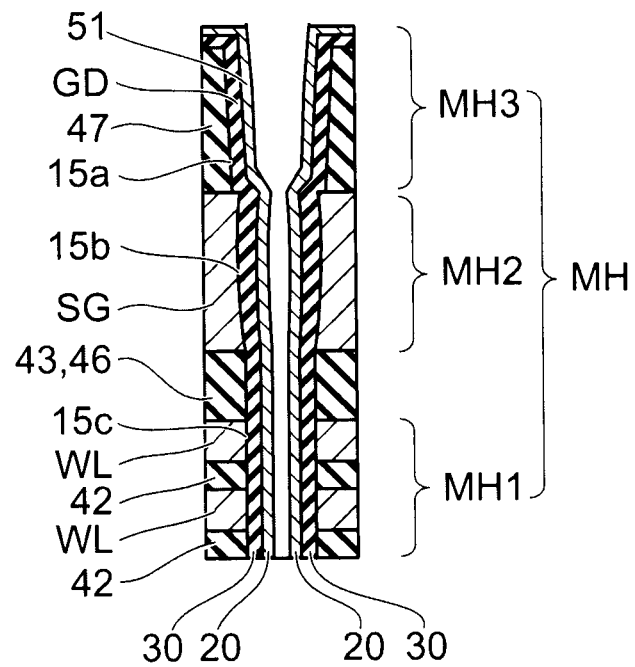

Next, as shown in FIG. 16A, in the memory hole MH, a gate insulating film GD is formed on the sidewall 15b of the second portion MH2 and the sidewall 15c of the third portion MH3. A memory film 30 is formed on the sidewall 15a of the first portion MH1.

Furthermore, inside the gate insulating film GD and the memory film 30, a first channel body 20 and a second channel body 51 are formed. The first channel body 20 and the second channel body 51 are e.g. polycrystalline silicon films. The first channel body 20 and the second channel body 51 are formed by e.g. the CVD method.

Figure 16B:
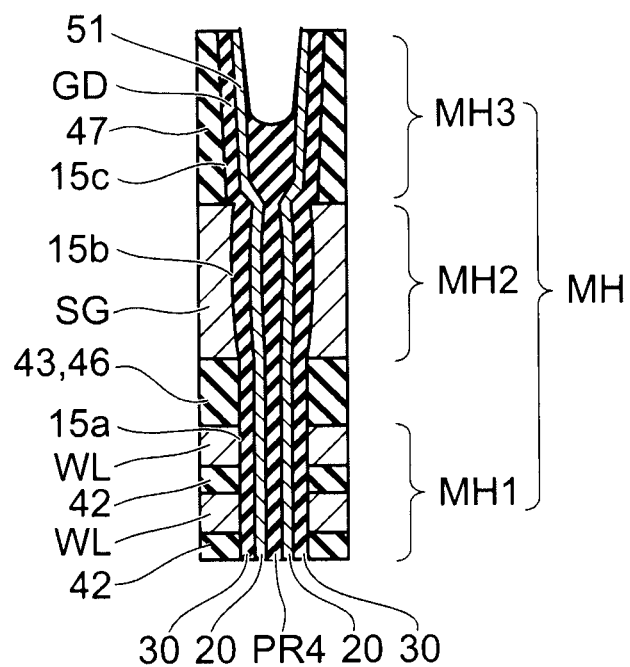

Next, as shown in FIG. 16B, above the second insulating layer 47 and in the memory hole MH, a photoresist PR4 is applied and etched back. Then, the shoulder portion of the second channel body 51 (polycrystalline silicon) provided on the upper end sidewall of the third portion MH3 is removed. At this time, the second channel body 51 (polycrystalline silicon) and the gate insulating film GD formed on the flat portion of the second insulating layer 47 are also removed. Subsequently, the photoresist PR4 is removed.

Figure 17A:
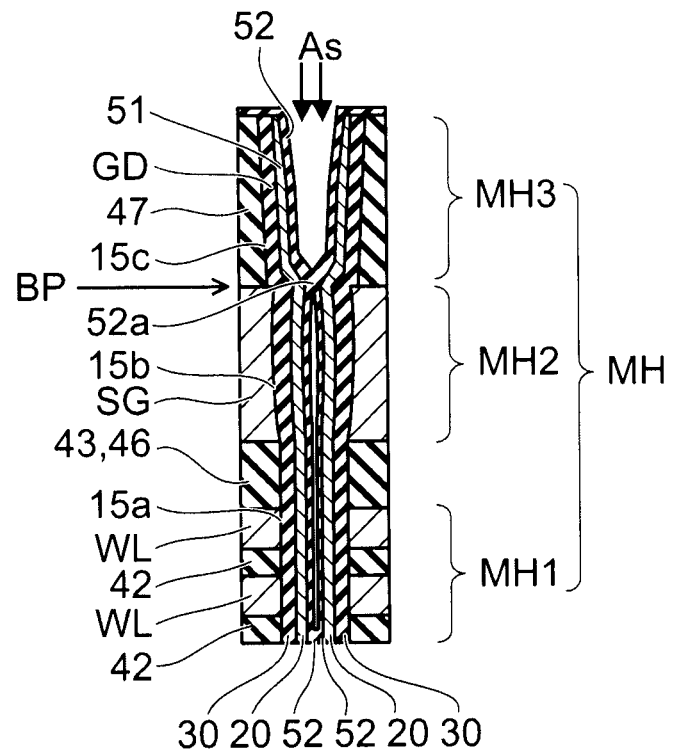

Next, as shown in FIG. 17A, inside the first channel body 20 and the second channel body 51 in the memory hole MH, a third insulating layer 52 is formed. The third insulating layer 52 includes silicon oxide. The third insulating layer 52 is formed by e.g. the ALD method. The third insulating layer 52 is formed until the boundary portion BP between the second portion MH2 and the third portion MH3 in the memory hole MH is occluded with the third insulating layer 52.

After forming the third insulating layer 52, through this third insulating layer 52, ion implantation of e.g. arsenic is performed on the second channel body 51 (e.g., polycrystalline silicon film) at the step difference between the second portion MH2 and the third portion MH3, and the second channel body 51 (e.g., polycrystalline silicon film) of the third portion MH3. In this ion implantation, ions are implanted not only into the second channel body 51, but also into the portion 52a of the third insulating layer 52 occluding the boundary portion BP. The impurity concentration of the portion 52a is higher than the impurity concentration of the third insulating layer 52 below (on the second portion MH2 of) the boundary portion BP. The impurity concentration of the portion 52a exceeds e.g. $1 \times 10^{18}$ cm$^{-3}$.

Figure 17B:
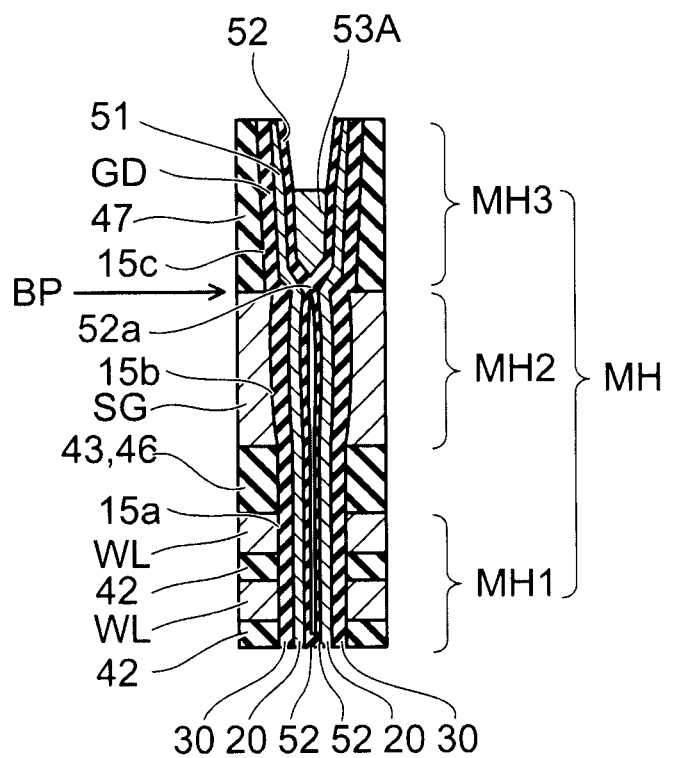

Next, as shown in FIG. 17B, above the boundary portion BP inside the third portion MH3, a first embedded portion 53A is embedded. The first embedded portion 53A includes e.g. non-doped polycrystalline silicon. The first embedded portion 53A is formed by e.g. the CVD method. After being embedded in the third portion MH3, the first embedded portion 53A is etched back to a prescribed depth. This etching is performed with an etchant such that the etching rate of the first embedded portion 53A is faster than the etching rate of the third insulating layer 52. Thus, the third insulating layer 52 is left on the upper sidewall of the third portion MH3.

Figure 18A:
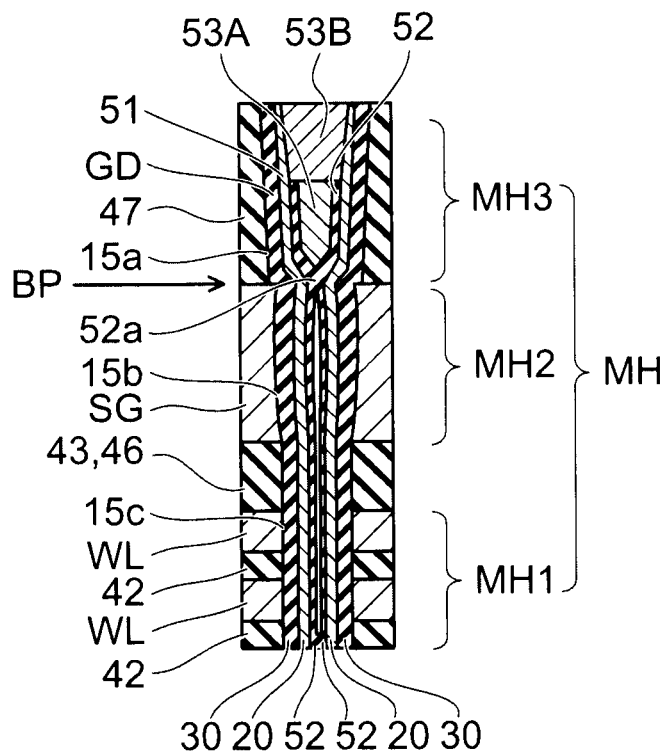

Next, as shown in FIG. 18A, part of the third insulating layer 52 in the third portion MH3 is removed to expose the second channel body 51. For instance, by isotropic etching with hydrofluoric acid, the third insulating layer 52 above the first embedded portion 53A is removed. Thus, the second channel body 51 is exposed. This etching is performed with an etchant such that the etching rate of the third insulating layer 52 is faster than the etching rate of the first embedded portion 53A. Thus, the exposed third insulating layer 52 is removed, whereas the third insulating layer 52 covered with the first embedded portion 53A is left.

Next, above the first embedded portion 53A inside the third portion MH3, a second embedded portion 53B is embedded.

The second embedded portion 53B includes e.g. polycrystalline silicon doped with phosphorus. The second embedded portion 53B is formed by e.g. the CVD method. The second embedded portion 53B is in contact with the second channel body 51 exposed in the third portion MH3. The second embedded portion 53B electrically connects the second channel body 51 to a metal wiring (source line SL, bit line BL) formed subsequently.

Figure 18B:
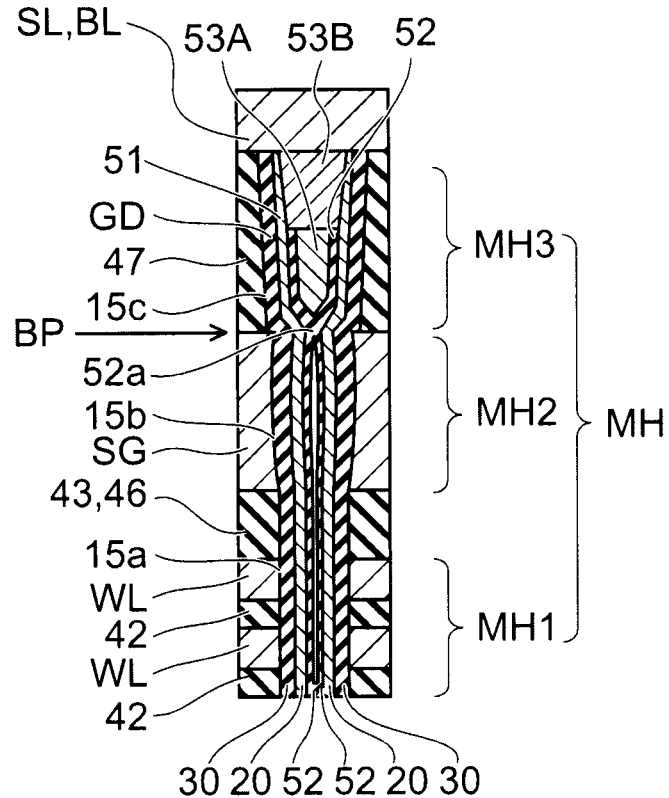

Subsequently, as shown in FIG. 18B, above the second embedded portion 53B, a source line SL or bit line BL as a metal wiring is formed.

In the manufacturing method according to the embodiment, in the ion implantation shown in FIG. 17A, ions of e.g. arsenic are implanted not only into the second channel body 51, but also into the third insulating layer 52 occluding the boundary portion BP with high concentration. Thus, in the thermal process after forming the memory cell MC and the select transistor ST, leakage to the third insulating layer 52 side of impurity such as arsenic implanted into the second channel body 51 is suppressed. If a high impurity concentration is maintained in the second channel body 51, the efficiency of generating the GIDL (gate induced drain leakage) current on the select gate SG side is increased, and the erasure characteristics of the memory are improved. Thus, the controllability of memory cells MC is improved.

In the third embodiment, the extending portion 531 shown in FIG. 13 may be provided in the second embedded portion 53B. The extending portion 531 can be provided as follows. In etching the third insulating layer 52 shown in FIG. 18A, as shown in FIG. 14A, by adjusting the etching condition, a recess 52h is formed between the first embedded portion 53A and the second channel body 51. Then, the second embedded portion 53B can be embedded also in this recess 52h.

The memory string described above is U-shaped. However, the memory string is not limited to being U-shaped, but may be I-shaped.

Figure 19:
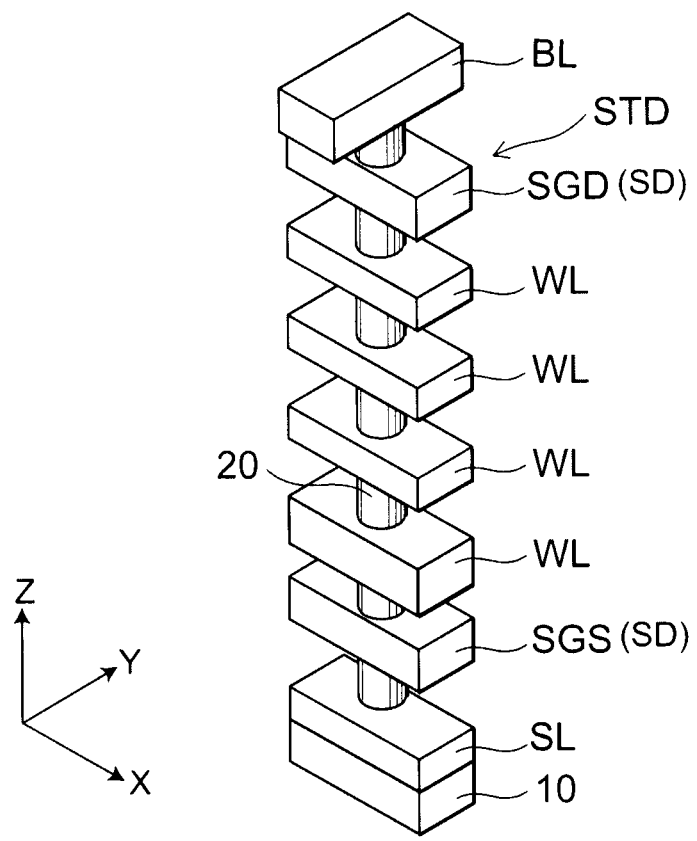
FIG. 19 is a schematic perspective view showing another example of the memory string.

FIG. 19 is a schematic perspective view showing another example of the memory string.

FIG. 19 shows an I-shaped memory string. In FIG. 19, only the conductive portions are shown, and illustration of the insulating portions is omitted.

In this structure, above a substrate 10, a source line SL is provided. A source side select gate (or lower select gate) SGS is provided thereabove. A plurality of (e.g., four) electrode layers WL are provided thereabove. A drain side select gate (or upper select gate) SGD is provided between the uppermost electrode layer WL and a bit line BL.

In this structure, the processes and structures described above with reference to FIGS. 9A to 12, FIGS. 14A to 15, and FIGS. 16A to 18B are applied to the select transistor ST provided in the upper end portion of the memory string. As described above, the embodiments provide a method for manufacturing a nonvolatile semiconductor storage device, and a nonvolatile semiconductor storage device, in which the controllability of memory cells is improved.

The embodiments and the variations thereof have been described above. However, the invention is not limited to these examples. For instance, those skilled in the art can modify the above embodiments or the variations thereof by suitable addition, deletion, and design change of components, and by suitable combination of the features of the embodiments. Such modifications are also encompassed within the scope of the invention as long as they fall within the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor storage device comprising:
   a first stacked body provided above a substrate and including a plurality of electrode layers and a plurality of first insulating layers alternately stacked layer by layer;
   a second stacked body provided above the first stacked body and including a select gate and a second insulating layer provided above the select gate;
   a memory film provided on a sidewall of a first portion of a through hole penetrating through the first stacked body and the second stacked body in stacking direction, the first portion penetrating through the first stacked body;
   a gate insulating film provided on a sidewall of a second portion of the through hole penetrating through the select gate and a sidewall of a third portion of the through hole penetrating through the second insulating layer;
   a channel body provided inside the gate insulating film and inside the memory film;
   a third insulating layer provided inside the channel body and including silicon oxide occluding a boundary portion between the second portion and the third portion in the through hole;
   a first embedded portion including silicon provided above the boundary portion in the third portion; and
   a second embedded portion provided above the first embedded portion in the third portion, being in contact with the channel body, and including silicon having higher impurity concentration than the first embedded portion.

2. The device according to claim 1, wherein the second embedded portion includes an extending portion provided between the first embedded portion and the third insulating layer.

3. The device according to claim 1, wherein hole diameter of the third portion is larger than hole diameter of the second portion.

4. The device according to claim 1, wherein the first embedded portion includes non-doped polycrystalline silicon.

5. The device according to claim 1, wherein impurity concentration of a portion of the third insulating layer occluding the boundary portion is higher than impurity concentration of a portion of the third insulating layer below the boundary portion.

* * * * *